United States Patent [19]
Baek et al.

[11] Patent Number: 5,913,219
[45] Date of Patent: Jun. 15, 1999

[54] DATABASE RECOVERY APPARATUS AND METHOD OF USING DUAL PLANE NONVOLATILE MEMORY

[75] Inventors: Young Sik Baek; Sung Il Jin; Yong Keol Kim, all of Taejon-Shi, Rep. of Korea

[73] Assignee: Electronics and Telecommunications Research Institute, Daeieon, Rep. of Korea

[21] Appl. No.: 08/794,933

[22] Filed: Feb. 4, 1997

[30] Foreign Application Priority Data

Feb. 16, 1996 [KR] Rep. of Korea .................. 96-3913

[51] Int. Cl.⁶ ................................... G06F 17/30
[52] U.S. Cl. ............................................... 707/202
[58] Field of Search ................... 707/202, 204, 707/8

[56] References Cited

U.S. PATENT DOCUMENTS

5,230,075  7/1993  Premerlani et al. .
5,317,752  5/1994  Jewett et al. ................... 395/182.12
5,715,447  2/1998  Hayashi et al. .................... 707/8

Primary Examiner—Wayne Amsbury
Assistant Examiner—Cheryl Lewis
Attorney, Agent, or Firm—Antonelli, Terry, Stout & Kraus, LLP

[57] ABSTRACT

There are effects that the page table does not have to be administrated since the process of backing up to a disc is not necessary, that the small unit lock is possible since the backup and recovery are performed in block units, that long copy time, which was one of the greatest disadvantages in performing the transaction, is negligible, so that all the burdens imposed on the transaction can be removed and, high speed transaction processing and recovery can be performed.

9 Claims, 9 Drawing Sheets

DATABASE RECOVERY APPARATUS AND METHOD OF USING DUAL PLANE NONVOLATILE MEMORY

BACKGROUND OF INVENTION

1. Field of Invention

The present invention relates to a database recovery apparatus and method of using a dual plane nonvolatile memory and, more particularly, to a database recovery apparatus and method of using a block-based dual plane nonvolatile memory.

2. Information Disclosure Statement

Although a disc is mainly used as the medium for storing a database in the prior art, there has emerged a main memory database system using a memory of large capacity due to the development of semiconductor technology.

The main memory database system requires a recovery algorithm to maintain the consistency of the database. The update of specific data in the database, being different from the general update, must maintain the consistency of all other stored data by recovering the original data even upon the occurrence of an error during the update.

The disc-based shadow page technology, one of the recovery methods for maintaining database consistency, has an original and a copy of the database at the time of performing the transaction for updating data in the database.

Figure 1:
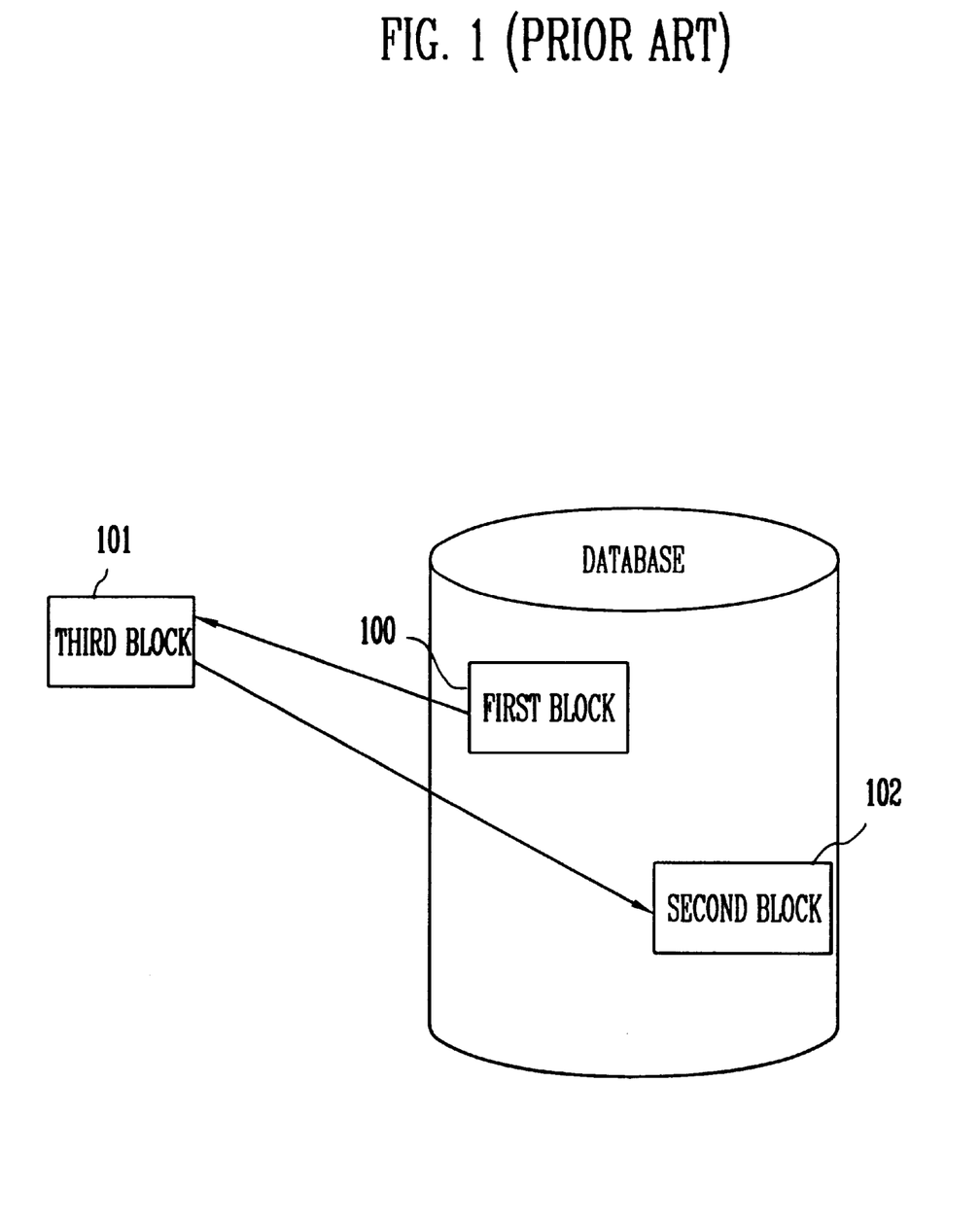
FIG. 1 is a block diagram to illustrate the database recovery method by the conventional disc based shadow page method.

FIG. 1 is a block diagram to illustrate the data recovery method from a database based on a conventional disc-based shadow page technology.

In general, the database is stored in the disc and divided into several blocks made up of page units. To update the data of the database stored in the disc at the time of performing the transaction, an original first block (100) is copied to a thirdblock (101) of the main memory. The third block (101) is updated and then copied to a second block (102), which is a disc area different from the first block (100).

Such recovery method requires a page table for mapping the database processing program to the block since the block is moved. Since the page table is stored in the disc, which is a stable memory, there is a disadvantage in that the page table must also be updated after the update of each data of the database.

Another disadvantage of the conventional disc-based shadow page technology is that small unit locking is difficult. The terminology "small unit locking" means allowing a plurality of processes to concurrently use a plurality of records which are different from each other. That is, database system can be concurrently accessed by various processes. If one block of data in the database is concurrently accessed by various processes, the database cannot have consistency. To prevent this inconsistency, a mark is tacked onto the block before using the block in the prior art. That is, the block is accessed after locking so as to make other processes wait. After use, the locking is released to allow other processes to access the block.

In the conventional disc-based database system, the original block must be copied to the main memory to update the block. The block is composed of units of pages and each page is composed of a plurality of records.

Using the functions of small unit locking, the concurrent use capabilities are increased so that the performance of a system is improved.

The modified content of the record, which each process accesses, is recorded in a log buffer in a log-based recovery technology, in contrast to the shadow page technology, where the modified content of is directly recorded to the record, which can cause problems to occur.

As an example, FIG. 1 depicts a case in which two transactions access records in various portions of a first block (100). After copying the first block (100) to the main memory, the two transactions perform the update after locking the records in various portions of the third block (101). If both of the transactions succeed, the transactions are completed after copying the third block (101) to the second block (102), which is a disc area different from the first block (100), and updating the page table. However, if one transaction succeeds and the other fails, the transaction can not be withdrawn or completed.

As described above, the data recovery from a database by the conventional disc-based shadow page method has problems in that the page table must be maintained and the small unit locking is difficult to achieve.

SUMMARY OF THE INVENTION

Therefore, the object of the present invention for solving the above described prior art problems is to provide the database recovery apparatus and method in which the administration of a page table is not necessary since there is no need to back up the disc by using the dual plane nonvolatile memory, and in which the small unit locking is possible by performing the backup and recovery in block unit.

A database recovery apparatus using a dual plane nonvolatile memory according to a first embodiment of the present invention to accomplish the above described object is characterized in that it comprises a memory for storing a database processing program; a power monitor and control circuit which receives a backup/recovery state signal, supplies a power source to maintain the backup state for a predetermined time if a power failure occurs in the backup state, and prevents the backup state from being performed by outputting an interrupt signal if the power failure occurs in a case other than the backup state; a dual plane nonvolatile memory comprising a volatile memory and nonvolatile memory divided into a plurality of block units whereby a chip is selected by a chip select signal, and performing a recovery process which copies block data of the nonvolatile memory to the volatile memory block in response to a backup/recovery control signal and an address read/write control signal and a backup process which overwrites the data of volatile memory block to the nonvolatile memory block; and a database processing circuit for loading the program from the memory, outputting the backup/recovery control signal to the power monitor and control circuit, outputting a chip select signal to the dual plane nonvolatile memory, and outputting the address and the backup/recovery control signal so that the recovery process is performed, and the data of the volatile memory block of the dual plane nonvolatile memory is updated through the address and the read/write control, and thereafter the backup process is performed by outputting the address and the backup recovery control signal.

A database recovery method applied to a database recovery apparatus using a dual plane nonvolatile memory in a database system according to the first embodiment of the present invention is characterized in that it comprises the steps of: a first step which copies a data of nonvolatile memory block to a volatile memory block in response to a backup/recovery control signal, updates the data copied to the volatile memory block in response to a read/write control signal, and thereafter checks whether the update partially succeeds; a second step which, if the update partially succeeded in the first step, informs the fact of process of backup to a power monitor and control, copies the updated block of volatile memory to the nonvolatile memory block, informs the fact of the update completion, and completes a transaction; and a third step which, if the update failed, in the first step, discards the updated block of volatile memory, informs the fact of the update failure, and completes the transaction.

A database recovery apparatus using a dual plane nonvolatile memory according to a second embodiment of the present invention to accomplish the above described object is characterized in that it comprises a memory for storing a database processing program; a power monitor and control circuit which receives a backup/recovery state signal, supplies a power source to maintain the backup state for a predetermined time if a power failure occurs in the backup state, and prevents the backup state from being performed by outputting an interrupt signal if the power failure occurs in a case other than the backup state; a first dual plane nonvolatile memory and a second dual plane nonvolatile memory comprising a volatile memory and nonvolatile memory divided into a plurality of block units whereby a chip is selected by a chip select signal, and performing a recovery process which copies block data of the nonvolatile memory to the volatile memory block in response to a backup/recovery control signal and an address read/write control signal and a backup process which overwrites the data of the volatile memory block to the nonvolatile memory block; and a database processing circuit for loading the program from the memory, outputting the backup/recovery control signal to the power monitor and control circuit, outputting a chip select signal to the first and second dual plane nonvolatile memory, and outputting the address and the backup/recovery control signal so that the recovery process is performed, the data of the volatile memory block of the first and second dual plane nonvolatile memory is updated through the address and the read/write control, and thereafter the address and the backup recovery control signal are outputted to the first dual plane nonvolatile memory, and then if the backup process fails, the database of the first dual plane nonvolatile memory is updated by reading the data prior to update of the second dual plane nonvolatile memory, and if the backup process of the first dual plane nonvolatile memory succeeds, the address and the backup/recovery control signal are outputted to the second dual plane nonvolatile memory and then if the backup process fails, the database of the second dual plane nonvolatile memory is updated by reading the updated data of the first dual plane nonvolatile memory.

A database recovery method applied to a database recovery apparatus using a nonvolatile memory constructed by dualization in a database system according to the second embodiment of the present invention is characterized in that it comprises the steps of: a first step which copies a nonvolatile memory block of a first and second dual plane nonvolatile memory to a volatile memory block, updates the data of a volatile memory block of the first and second dual plane nonvolatile memory, and thereafter checks whether the update performance partially succeeds; a second step which, if the update succeeded in the first step, informs the fact of process of backup to a power monitor and control, copies the updated volatile memory block of the first dual plane nonvolatile memory, and thereafter checks whether the copy succeeds; a third step which, if the copy failed in the second step, recovers the nonvolatile memory block of the first dual plane nonvolatile memory to a value prior to the update by using the nonvolatile memory block of the second dual plane nonvolatile memory, thereafter informs the fact of the update failure, and ends the transaction; a fourth step which, if the copy succeeded in the second step, informs the fact of the progress of backup to the power monitor and control, copies the volatile memory block of the second dual plane nonvolatile memory to the nonvolatile memory block, and checks whether the copy succeeds; a fifth step which, if the copy succeeded in the fourth step, informs the fact of the update completion and ends the transaction, or if the copy failed in the fourth step, recovers the nonvolatile memory block of the second dual plane nonvolatile memory to the latest updated value by using the nonvolatile memory block of the first dual plane nonvolatile memory, informs the fact of the update completion, and ends the transaction; and a sixth step which, if the update performance failed in the first step, discards the updated volatile memory block of the first and second dual plane nonvolatile memory, informs the fact of the update failure, and ends the transaction.

DETAILED DESCRIPTION OF THE INVENTION

A detailed description of the embodiments of the present invention is given below with reference to the accompanying drawings.

In general, a conventional nonvolatile memory using strong dielectric material has the advantageous characteristic that it does not lose data even when the electric power supply thereof is suddenly disrupted or cut-off, but also, however, has a disadvantage in that there is a limitation on the writibility—the number of times data can be written in it—of the nonvolatile memory. During operation, data is written into the nonvolatile memory thousands of times per second.

Recently, research results on a method for performing the writing more than $10^{10}$ times in the nonvolatile memory are being presented.

To increase the number of times of writing in the nonvolatile memory, although preferable strong dielectric materials are being found and semiconductor manufacturing processes are being researched, one of the more promising approaches is writing in a nonvolatile memory made up of dual cells or dual chips as the storage cells.

Figure 2:
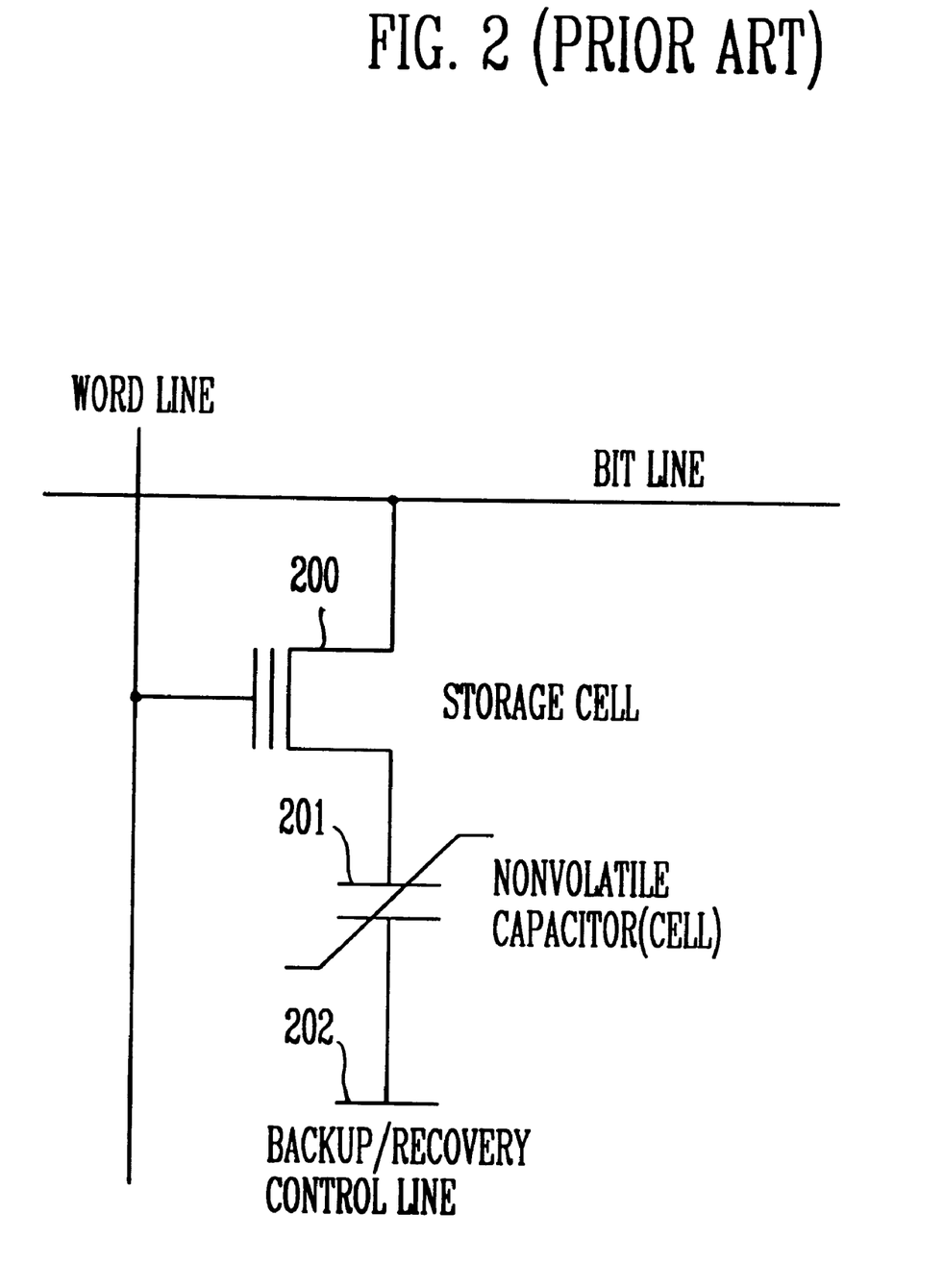
FIG. 2 is a structural drawing of nonvolatile memory composed of general dual cells.

FIG. 2 shows a structural drawing of a nonvolatile memory composed of general dual cells.

The nonvolatile memory composed of dual cells performs the writing and reading of the storage cell during normal operation, but upon a power failure, saves the data contained in the storage cell by transferring it to the nonvolatile capacitor (cell) through an external backup/recovery control line.

Figure 3:
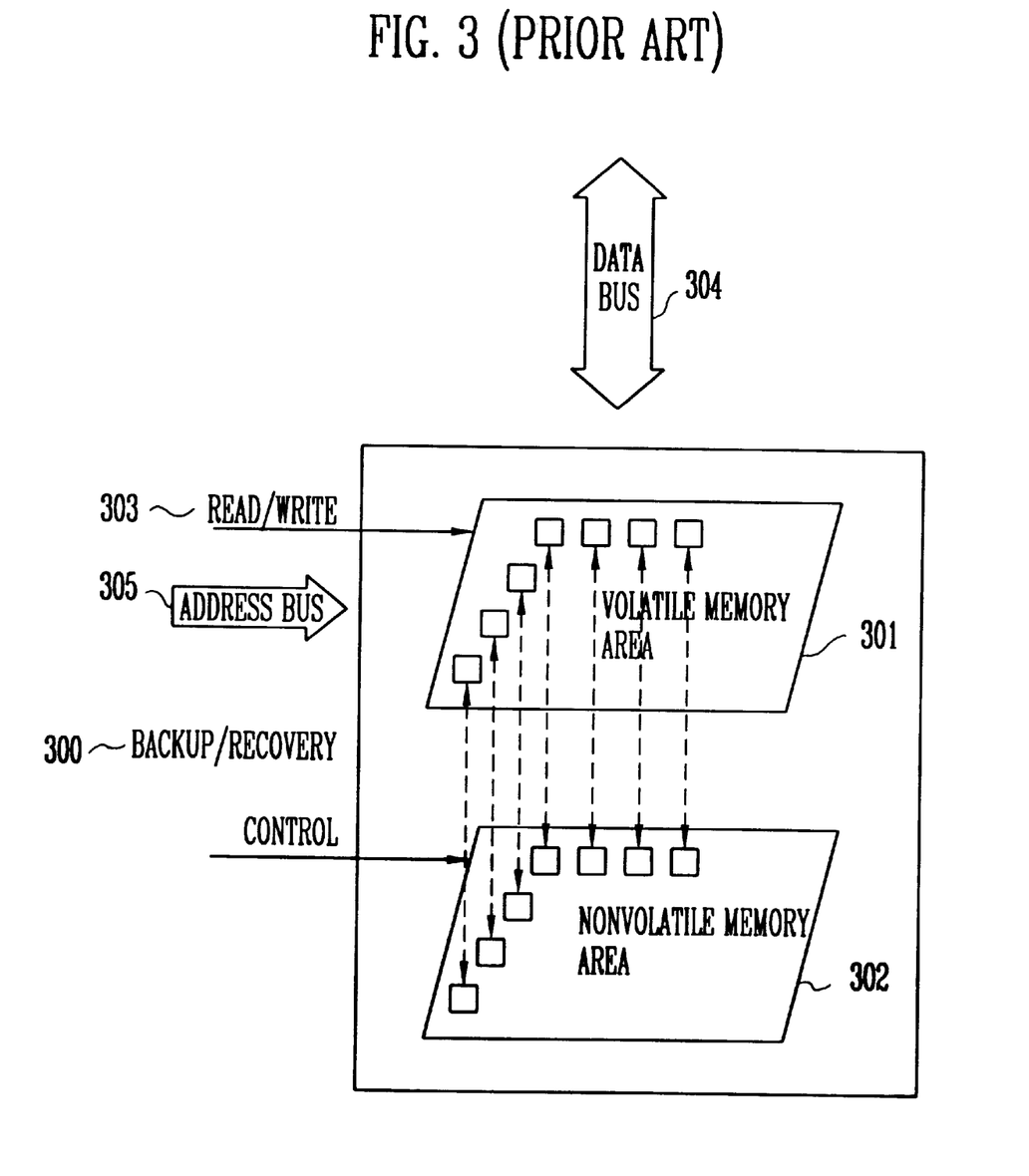
FIG. 3 is an interior structural drawing of general dual plane nonvolatile memory.

FIG. 3 shows an internal structural drawing of nonvolatile memory composed of general dual cells.

The inside of the nonvolatile memory composed of dual cells includes a volatile memory area 301 composed of volatile cells and a nonvolatile memory area 302 composed of nonvolatile cells. At the instance of a power failure, the data of the nonvolatile memory area 301 is concurrently copied to the nonvolatile memory area 302 in a unit of the cell by an external backup/recovery control line 300.

As described above, the access to the data during normal operation is performed on the volatile memory area 301. In the present application, the memory of the above described structure is defined as a "dual plane nonvolatile memory." In the dual plane nonvolatile memory, the problem of limitation of writibility does not substantially occur.

Another method for increasing the writibility of nonvolatile memory is to evenly (substantially equal number of times) use the various portions of nonvolatile memory.

That is, since the nonvolatile memory is accessible in byte units, there is a limitation of writibility times for each byte unit. However, counting the writing times for each byte unit requires a greater amount of memories. Therefore, if the nonvolatile memory is divided into several blocks and the blocks are evenly (substantially equal number of times) used, there is an effect that the lifetime of the chip is increased in proportion to the number of blocks.

Normally, the database system is composed of several tens of thousands to several hundreds of thousands of blocks. However, in the database system, if the database recovery method by the shadow page method utilizing the conventional dual plane nonvolatile memory is performed, since the entire nonvolatile memory must be backed up and recovered even when updating one block, several process cannot concurrently access several blocks and also the small unit lock inside of the block is not possible.

Also, since the accesses to the nonvolatile memory arises several ten thousand times to several hundred thousand times per second, the lifetime of the entire nonvolatile memory is rapidly decreased.

For example, when the limitation on the writing times of nonvolatile memory is $10^{10}$ times, if the transaction is performed 100,000 times per second, the memory can be used for a time period of $10^5$ seconds (27 hours), thereby rendering it impractical.

However, if the chip is designed to be divided into several blocks, as the number of blocks is increased, the usable time is extended. For example, if one record is 4K bytes and the chip capacity is 4M bytes, then 1,000 blocks can be formed. If these blocks are evenly used (substantially equal number of times), the chip can be used for a time period of 27 (hours)×1000 hours (about 3 years).

Figure 4:
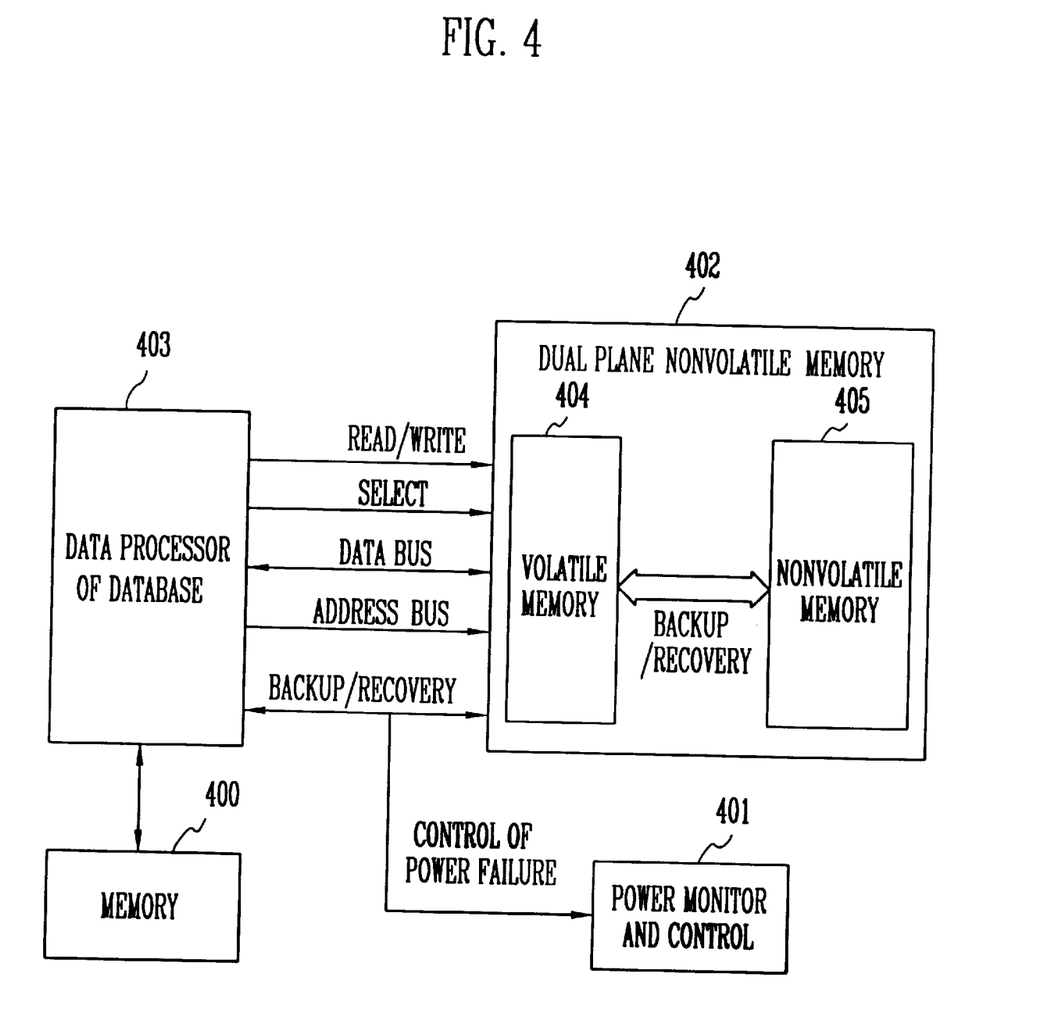
FIG. 4 is a block diagram of the database recovery apparatus using the dual plane nonvolatile memory according to the first embodiment of the present invention.

FIG. 4 is a block diagram showing the database recovery apparatus using the dual plane nonvolatile memory according to the first embodiment of the present invention.

In the operation of the database recovery apparatus using the dual plane nonvolatile memory of the present invention, the database data processor 403 composed of a conventional processor chip is characterized in that it performs the database recovery process according to the database processing program stored in the memory section 400.

In addition, the dual plane nonvolatile memory 402 includes a volatile memory 404 and a nonvolatile memory 405.

Furthermore, the database data processor 403 selects a chip by outputting a chip select signal to the dual plane nonvolatile memory 402 to update the data of the database.

The original data of nonvolatile memory 405 of each block unit is copied to the volatile memory 404 by outputting an address through an address bus and a backup/recovery control signal to the dual plane nonvolatile memory 402. This process is referred to as the "recovery."

The database data processor 403 updates the data copied to the volatile memory 404 by outputting a read/write control signal. In addition, the database data processor 403 updates the block copied to the volatile memory 404, and then controls to overwrite the data of volatile memory 404 to the nonvolatile memory 405 by outputting a backup/recovery control signal and an address to the dual plane nonvolatile memory 402. This process is referred to as "backup".

The database data processor 403 represents the current state of backup/recovery by outputting a backup/recovery control signal to the power monitor and control 401.

The power monitor and control 401 monitors the power failure of the power source, and if a power failure occurs during the backup, which is a process of overwriting the data of volatile memory 404 to the nonvolatile memory 405 according to the backup/recovery state signal inputted from the database data processor 403, the power monitor and control 401 guarantees the overwriting by supplying reserve power for a certain duration of time.

If the power failure occurs in a state other than the process of backup, the power monitor and control 401 does not allow the performance of backup by outputting an interrupt to the database data processor 403.

Figure 5:
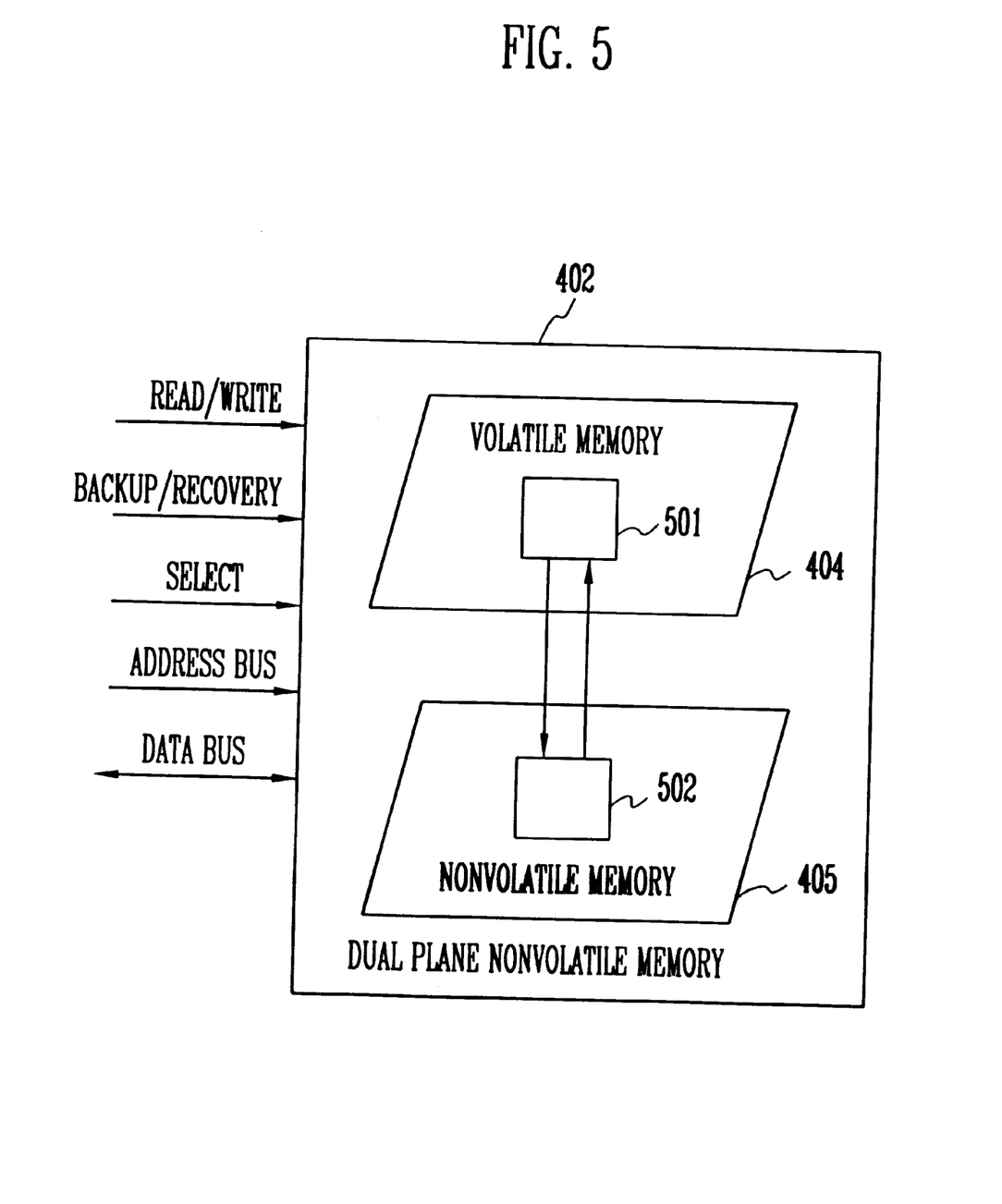
FIG. 5 is a block diagram to illustrate the database recovery method by the shadow page technology of the present invention.

FIG. 5 shows a flow chart illustrating the database recovery of the shadow page method according to the present invention.

First, a copy 501 of the original data 502 from nonvolatile memory 405, is copied to volatile memory 404 to update the data of the database. After updating a block of data copied 501 to the volatile memory 404, the updated data is written over the original data 502 in nonvolatile memory 405. Before the overwriting operation is performed, the fact that the data will be conveyed to the power monitor and control 401 is informed so that it is guaranteed that the overwriting will be performed by the power monitor and control 401 even if a the power failure occurs during the overwriting. The present invention, being different from the conventional methods, does not have to administrate the page table.

Figure 6:
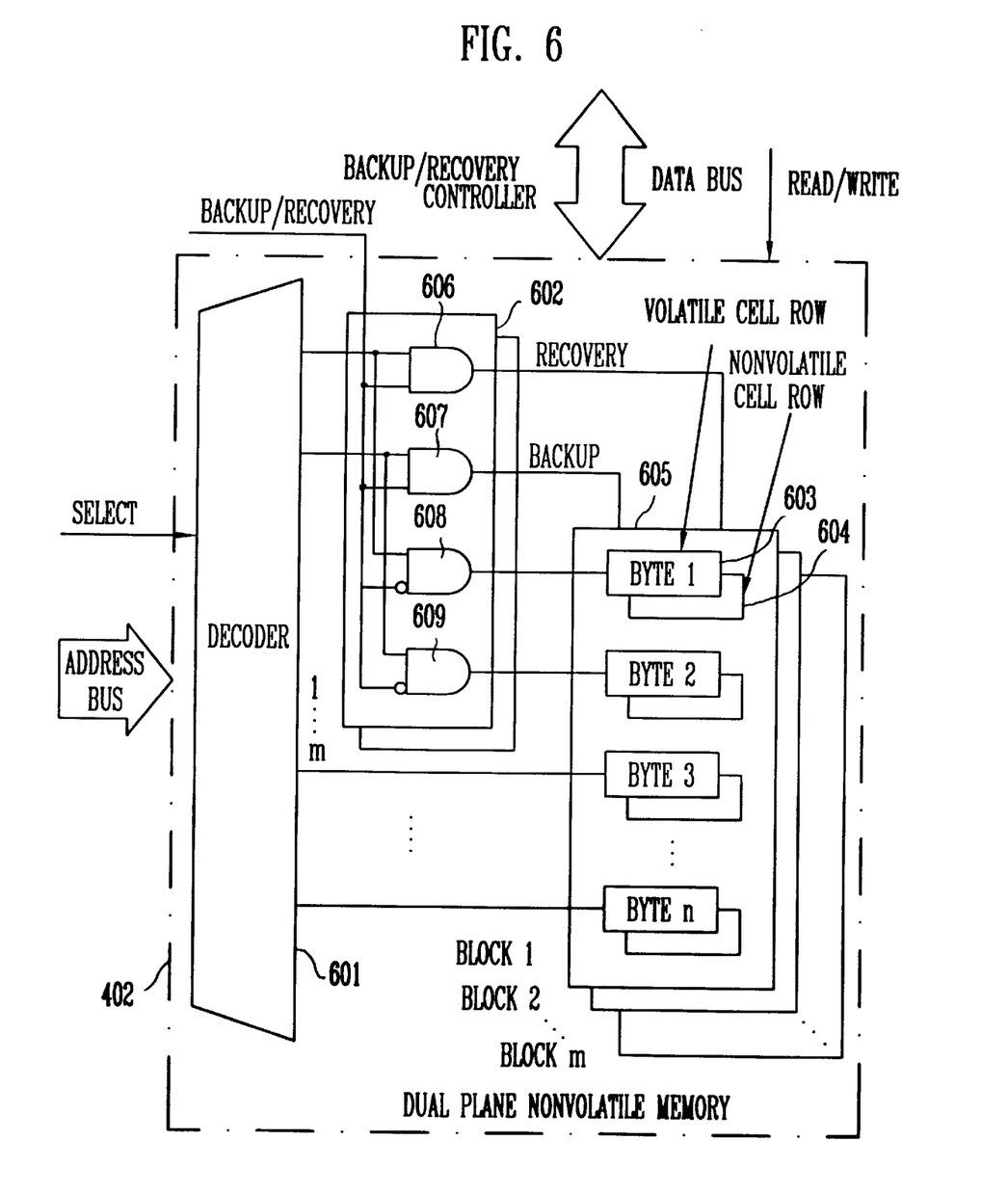
FIG. 6 is a detailed structural drawing to show a block-based dual plane nonvolatile memory according to the present invention.

FIG. 6 shows a detailed structural drawing of the block-based dual plane nonvolatile memory according to the present invention.

The dual nonvolatile memory 402 comprises a decoder 601 m number of backup/recovery controllers 602, volatile memory blocks 603, and nonvolatile memory blocks 604.

The decoder 601 receives a chip select signal and an address, then decodes the signal with the address to output a new signal.

Each of the backup/recover controller 602 receives the first and second outputs of the decoder 601 and receives a backup/recovery control signal from the database data processor. Each controller then outputs a backup/recovery signal. The volatile memory 603 is divided into m number of blocks, each of which is divided into n number of bytes. The blocks receive the recovery control signal and the byte enable controllers 602, and also receive the byte enable signals for the other bytes of data from the decoder 601. Once received, the volatile memory updates an activated byte of data through the read/write control and data bus of the database data processor. The volatile memory then outputs the updated data in block units in response to the backup control signal of the backup/recovery controller 602.

The nonvolatile memory 604 is divided into m number of blocks, each of which is divided into n number of bytes, in correlation to the volatile memory 603, so that block units of stored data can be output to the volatile memory 603 in response to the recovery control signal of the backup/recovery controller 602. The nonvolatile memory must also store it in response to the backup control signal of the backup/recovery controller 602.

The backup/recovery controller 602 comprises a first logic AND gate 606 which receives the first output of the decoder 601 and the backup/recovery control signal, ANDs the first output and the backup/recovery control signal, and outputs a recovery control signal; a second logic AND gate 607 which receives the second output of the decoder 601 and the backup/recovery control signal, ANDs the second output and the backup/recovery control signal, and outputs a recovery control signal; a third logic AND gate 608 which receives the first output of the decoder 601 and the inverted backup/recovery control signal, ANDs the first output and the inverted backup/recovery control signal, and outputs a first byte enable signal; a fourth logic AND gate 609 which receives the second output of the decoder 601 and the inverted backup/recovery control signal, ANDs, the second output and the inverted backup/recovery control signal, and outputs the second byte enable signal.

Although the conventional dual plane nonvolatile memory structure controls the entire chip using one control line to solve the limitation on the writing times due to the degradation of strong dielectric material, the present invention can back-up and recover in block units the contents of the dual plane nonvolatile memory.

Since the block inside the dual plane nonvolatile memory is divided into several thousand to several million blocks, each block cannot be controlled by external pins. Therefore, the present decoder 601 solves this control problem.

In general, the volatile memory 603 and nonvolatile memory 604 can be divided into any number of blocks and each block can be divided into any number of bytes.

There are m number of backup/recovery controllers 602 to correspond to the m number of blocks, and the backup/recovery controllers 602 outputs the backup/recovery control signal to the volatile memory 603 and nonvolatile memory 604 using the first and second outputs of the decoder 601.

In the operation of the data recovery apparatus of the present invention, the decoder 601 decodes the address inputted from the database data processor 403 and the chip select signal and outputs them.

The backup/recovery controller 602 outputs the backup control signal and recover control signal by using the backup/recovery control signal inputted from the database data processor 403 and decoding signals of the first and second pins inputted from the decoder 601, and outputs the first byte and second byte enable signals.

For example, the backup/recovery controller 602 performs a general memory access when the backup/recovery control signal inputted from the database data processor 403 is '0', since the control signals outputted by the first and second logic AND gates are all '0' and the byte of address which is deactivate by the output of the decoder 601 is enabled.

When the backup/recovery control signal is '1', if the first output of the decoder 601 is in the activation state, that is, if the first output of the decoder 601 indicates '0' address (first byte), the output of the first logic AND gate 606 is activated so that the recovery control signal is outputted, and if the second output of the decoder 601 is in the activation state, that is, if the second output of the decoder 601 indicates '1' address (second byte), the output of the second logic AND gate 607 is activated so that the backup control signal is outputted.

The volatile memory 603 and nonvolatile memory 604 of each block 605 copies the data of nonvolatile memory 604 for the entire block to the volatile memory 603 if they receive the recovery control signal from the backup/recovery controller 602.

Thereafter, if the backup/recovery control signal becomes '0', the data is updated through the data bus in response to the read/write control signal of activated byte address of volatile memory 603.

If the backup/recovery control signal inputted from the database data processor 403 becomes '1' so that the backup control signal from the backup/recovery controller 602 is outputted, the updated data of volatile memory 603 for the entire block is written into nonvolatile memory 604.

The present invention can control the backup and recovery for each block by operating as described above.

Figure 7:
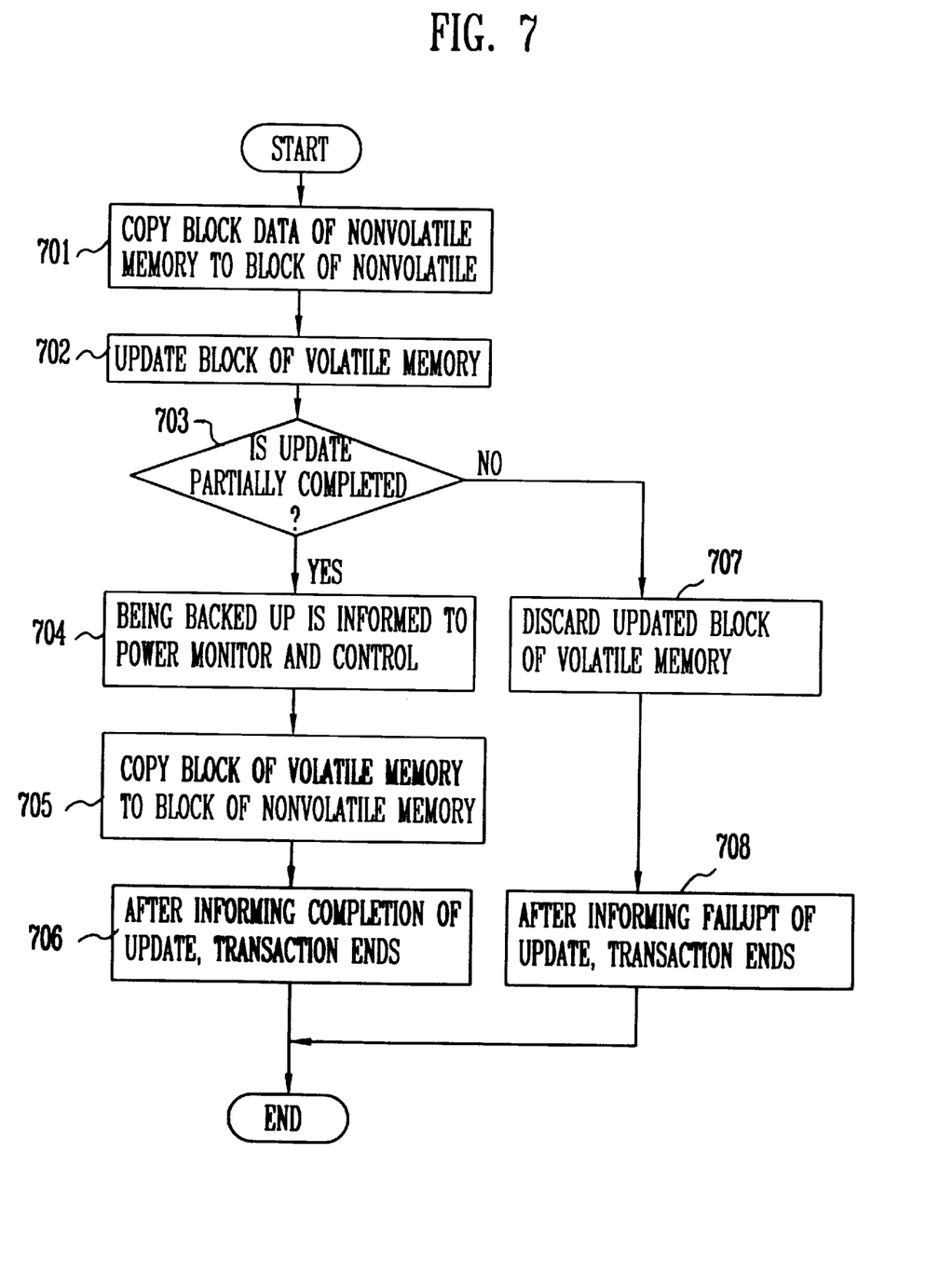
FIG. 7 is a flow chart to illustrate the database recovery method using the dual plane nonvolatile memory according to the first embodiment of the present invention.

FIG. 7 shows a flow chart to illustrate an embodiment of the database recovery method according to the present invention.

If the transaction begins, the data of nonvolatile memory block is copied in step 701 to nonvolatile memory block in response to the backup/recovery control signal.

Thereafter, the data copied to the volatile memory block is updated in step 702 in response to the read/write control signal.

Next, the partial completion of update is checked in step 703 and if successful, the fact that the backup is proceeding is informed to the power monitor and control 401.

After the updated block of the volatile memory is copied to the nonvolatile memory block in step 705, the update completion is informed to the power monitor and control 401 and the transaction ends in step 706.

If the update fails in step 703, the block of updated volatile memory is abandoned in step 707, and after the update failure is informed to the power monitor and control 401, the transaction ends in step 708.

Here, the time in copying the block is negligible since the copying is concurrently performed in the cell unit, unlike the conventional method.

In one embodiment of the present invention, when copying the updated volatile memory block to the nonvolatile memory block, if a problem arises so that an error in copying occurs, the block may not be recoverable.

Although the copying is performed in a very short time, since there exists a possibility that such a problem can occur, a structure which can improve the ability of block recovery at the time of occurrence of copying error is necessary for a highly reliable system.

Another embodiment of the present invention is described below in detail with reference to the accompanying drawings.

Figure 8:
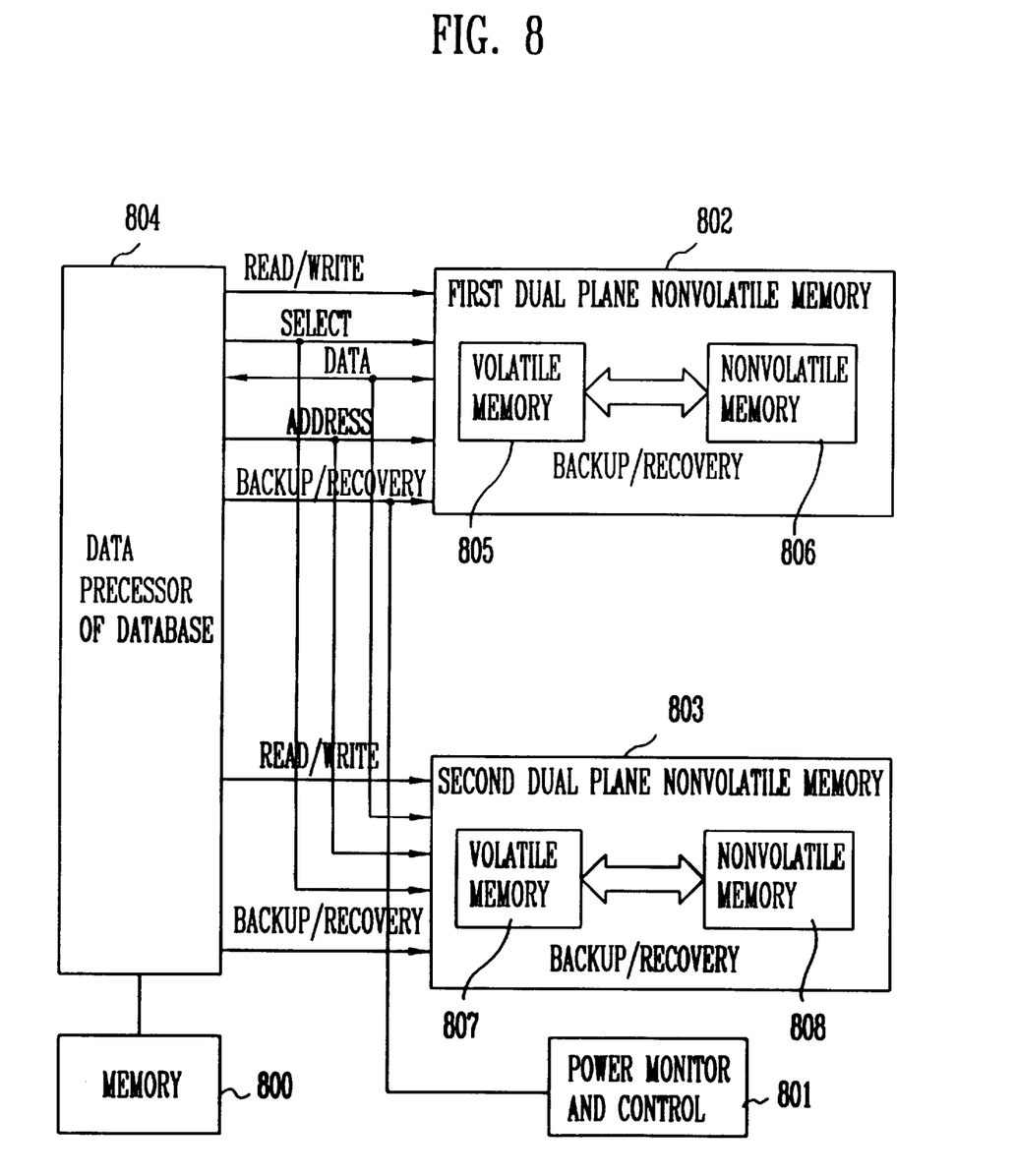
FIG. 8 is a block diagram of a database recovery apparatus using a dual plane nonvolatile memory according to a second embodiment of the present invention.

FIG. 8 shows a block diagram of another embodiment of database recovery apparatus using the dual plane nonvolatile memory according to the present invention.

In another embodiment of the present invention, the database recovery apparatus is constructed in dual structure having a first dual plane nonvolatile memory 802 and a second dual plane nonvolatile memory 803 to guarantee the high reliability.

That is, the dual structure according to the second embodiment of the present invention is composed of a memory 800 for storing a program, a power monitor and control 801 for storing a program, a power monitor and control 801 for controlling the power supply in response to the power failure or not receiving the signal corresponding to the present status of backup/recovery, a first and second dual plane nonvolatile memory 802, 803, and a database data processor 804.

Here, the dual plane nonvolatile memory is constructed as shown in FIG. 6.

In operation, the data processor of database 804 copies a nonvolatile memory block 806, 808 of the first and second dual plane nonvolatile memory 802, 803 to a volatile memory block 805, 807 in response to the backup/recovery control signal.

Next, the data processor of database 804 updates the data of volatile memory block 805, 807 of the first and second dual plane nonvolatile memory 802, 803 in response to the address and read/write control signal.

At this time, the above described processes of copying and updating are concurrently performed by the hardware, i.e. chips, by being controlled together through the address bus of the first dual plane nonvolatile memory 802 and the second dual plane nonvolatile memory 803 by the database data processor 804.

After the update is performed, the databasse data processor 804 performs the backup of the first dual plane nonvolatile memory 802, and then discerns whether the backup is completed.

If the backup fails, the database data processor 804 recovers the nonvolatile memory block of the first dual plane nonvolatile memory 802 using the data of nonvolatile memory block of the second dual plane nonvolatile memory 803, and processes the update as a failure (update failure).

To the contrary, if the backup succeeds, the database data processor 804 performs the backup of the second dual plane nonvolatile memory 803, and if it fails, recovers the data of the second dual plane nonvolatile memory 803 from the first dual plane nonvolatile memory 802, and completes the update (update success).

Figure 9:
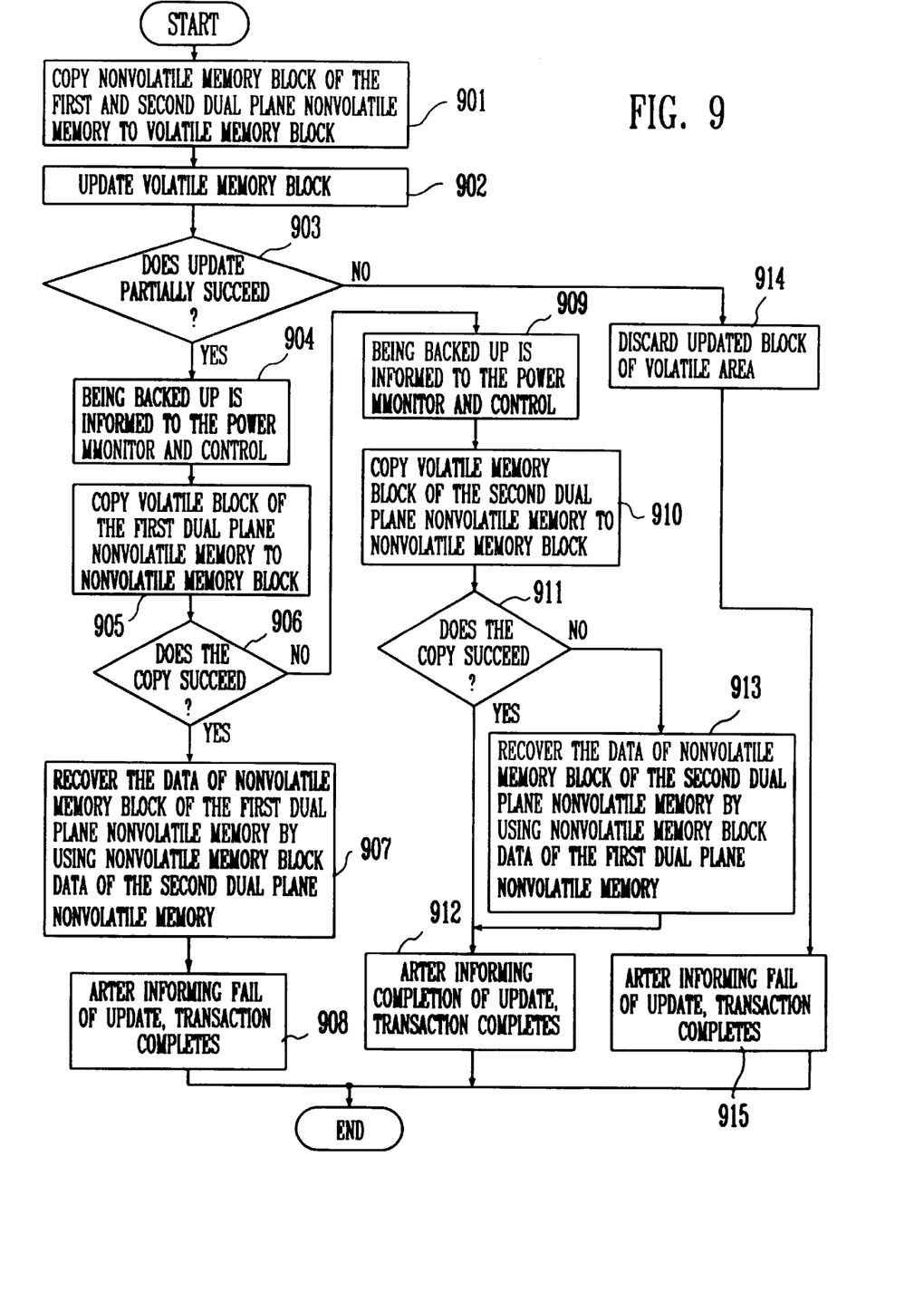
FIG. 9 is a flow chart to illustrate the database recovery method according to the second embodiment of the present invention.

FIG. 9. shows a flow chart to illustrate another embodiment of database recovery method according to the present invention.

When the transaction begins, the database data processor 804 copies the nonvolatile memory blocks 806, 808 of the first and second dual plane nonvolatile memory blocks 802, 803 to the volatile memory blocks 805, 807 (step 901).

Next, the database data processor 804 updates the volatile memory blocks 805, 807 of the first and second dual plane nonvolatile memory blocks 802, 803 (step 902).

After the update is completed, the database data processor 804 discerns whether the update is partially completed (step 903) and if the update is successful, the database data processor 804 informs the power monitor and control circuit 801 that the backup is in process (step 904).

The database data processor 804 copies the updated volatile memory block 805 of the first dual plane nonvolatile memory 802 to the nonvolatile memory block 806 (step 905).

The database data processor 804 discerns whether the backup process or copying of the first dual plane nonvolatile memory 802 is completed (step 906). Since the copying is performed very quickly, it means that there is sufficient time for the subsequent command to copy to be performed, because the power failure does not occur during the copying.

If the copy fails, the database data processor 804 restores the nonvolatile memory block 806 of the first dual plane nonvolatile memory 802 to the value prior to the update using the nonvolatile memory block 808 of the second dual plane nonvolatile memory 803 (step 907), informs the power monitor and control 801 of the update failure, and completes the transaction (step 908).

If the copy succeeds, the data processor 804 informs the progress of the backup to the power monitor and control circuit (step 909). The data processor 804 then performs the backup operation of copying the volatile memory block 807 of the second dual plane nonvolatile memory 803 to the nonvolatile memory block 808 (step 910).

The data processor 804 discerns whether the copy is completed (step 911), and if the copy is completed, the data processor 804 informs of the update completion to the power monitor and control 801 and completes the transaction (step 912).

If the copy fails (step 911), the data processor of database 804 restores the nonvolatile memory block 808 of the second dual plane nonvolatile memory 803 to the latest updated value by using the nonvolatile memory block 806 of the first dual plane nonvolatile memory 802, and thereafter informs of the update completion to the power monitor and control 801, and completes the transaction (step 912).

If the update process partially fails (step 903), the data processor 804 discards the updated volatile memory blocks 805, 807 of the first and second dual plane nonvolatile memory 802, 803 (step 914), informs of the update failure to the power monitor and control 801, and completes the transaction (step 915).

As described above in conjunction with the construction and operation of the data recovery apparatus, since the database recovery apparatus of the present invention uses the nonvolatile memory, there is no need to backup the data to the disc, and the long copy time, which has been one of the greatest disadvantages in performing the transaction, is reduced to such a minimal degree as can be negligible so that all a reliable and high speed transaction for data recovery and update can be performed.

What is claimed is:

1. A database recovery apparatus, comprising:
   a memory for storing a database processing program;
   a power monitor and control circuit which receives a backup/recovery state signal, supplies a power source to maintain the backup state for a predetermined time if a power failure occurs during the backup state, and prevents the backup state from being performed by outputting an interrupt signal if the power failure occurs at any time other than during the backup state;

a dual plane nonvolatile memory, including a volatile memory and a nonvolatile memory divided into a plurality of block units whereby a chip is selected by a chip select signal, said dual plane nonvolatile memory performing a recovery process which copies a block unit of data of said nonvolatile memory to a block of said volatile memory in response to a backup/recovery control signal and an address read/write control signal and a backup process which overwrites the data of said volatile memory block to said nonvolatile memory block; and database processing means for loading the program, outputting the backup/recovery control signal to said power monitor and control circuit, outputting a chip select signal to said dual plane nonvolatile memory, and outputting the address and the backup/recovery control signal so that the recovery process is performed, the data of said volatile memory block of said dual plane nonvolatile memory is updated through the address and the read/write control, and thereafter the backup process is performed by outputting the address and the backup recovery control signal.

2. The database recovery apparatus of claim 1, wherein said dual plane nonvolatile memory comprises:

decoding means which receives the chip select signal and the address and decodes and outputs said chip select signal and said address;

at least one backup/recovery control circuit which receives the first and second outputs of said decoding means, receives the backup/recovery control signal from said database processing means, outputs the backup and control signal, and outputs an enable signal of the first byte and second byte of memory;

a volatile memory which is divided into a plurality of blocks each of which is divided into a plurality of bytes, receives the data in block unit in response to the recovery control signal of said backup/recovery control circuit, receives the enable signal of the first byte and second byte of each block from said backup/recovery control circuit, receives the enable signal of remaining bytes from said decoding means, updates the data of the activated byte of block through a read/write control and data bus of said database processing means, and outputs the updated data of block unit according to the backup control signal of said backup/recovery control circuit; and a nonvolatile memory which is divided into a plurality of blocks each of which is divided into a plurality of bytes, outputs the stored data of block unit to said volatile memory in response to the recovery control signal of said backup/recovery control circuit, and receives and stores the updated data of block unit from said volatile memory in response to the backup control signal of said backup/recovery control circuit.

3. The database recovery apparatus of claim 2, wherein said backup/recovery control circuit comprises:

a first logic AND gate element which receives the first output of said decoding means and the backup/recovery control signal from said database processing means, ANDs said first output and said backup/recovery control signal, and outputs the recovery control signal;

a second logic AND gate element which receives the second output of said decoding means and the backup/recovery control signal from said database processing means, ANDs said second output and said backup/recovery control signal, and outputs the backup control signal;

a third logic AND gate element which receives the first output of said decoding means and the inverted backup/recover control signal, ANDs said first output and said inverted backup/recovery control signal, and outputs the enable signal of the first byte; and a fourth logic AND gate element which receives the second output of said decoding means and the inverted backup/recovery control signal, ANDs said second output and said inverted backup/recovery control signal, and outputs the enable signal of second byte.

4. The database recovery apparatus of claim 3, wherein said backup/recovery control circuit performs a general memory access process when the backup/recovery control signal inputted from the database processing means is "0", and when the backup/recovery control signal is "1", if the decoding means indicates "0" address (first byte), outputs the recovery control signal, and if the decoding means indicates "1" address (second byte), outputs the backup control signal.

5. The database recovery apparatus of claim 2, wherein said nonvolatile memory and said volatile memory are each respectively divided into m number of blocks, each of which is divided into n number of bytes, and the number of said backup/recovery control circuits is equal to m, the number of blocks of said volatile memory and said nonvolatile memory.

6. A database recovery apparatus, comprising:

a memory for storing a database processing program;

a power monitor and control circuit which receives a backup/recovery state signal, supplies a power source to maintain the backup state for a predetermined time if a power failure occurs in the backup state, and prevents the backup state from being performed by outputting an interrupt signal if the power failure occurs at any time other than during the backup state;

a first dual plane nonvolatile memory and a second dual plane nonvolatile memory, including a volatile memory and nonvolatile memory divided into a plurality of block units, whereby a chip is selected by a chip select signal, and performs a recovery process which copies a block unit of data of said nonvolatile memory to said volatile memory block in response to a backup/recovery control signal and an address read/write control signal and a backup process which overwrite the data of volatile memory block to said nonvolatile memory block; and database processing means for loading the program from said memory, outputting the backup/recovery control signal to said power monitor and control circuit, outputting a chip select signal to said first and second dual plane nonvolatile memory, and outputting the address and the backup/recovery control signal so that the recovery process is performed, the data of said volatile memory block of said first and second dual plane nonvolatile memory is updated through the address and the read/write control, and thereafter the address and the backup recovery control signal are outputted to the first dual plane nonvolatile memory, and then if the backup process fails, the database of the first dual plane nonvolatile memory is updated by reading the data of the second dual plane nonvolatile memory prior to update, and if the backup process of the first dual plane nonvolatile memory succeeds, the address and the backup/recovery control signal are outputted to the second dual plane nonvolatile memory and then if the backup process fails, the database of the second dual plane nonvolatile memory is updated by reading the updated data of the first dual plane nonvolatile memory.

7. The database recovery apparatus of claim 6, wherein said dual plane nonvolatile memory comprises:

decoding means which receives the chip select signal and the address and decodes and outputs said chips select signal and said address;

at least one backup/recovery control circuit which receives the first and second outputs of said decoding means, receives the backup/recovery control signal from said database processing means, outputs the backup and control signal, and outputs an enable signal of the first byte and second byte of memory;

a volatile memory which is divided into a plurality of blocks each of which is divided into a plurality of bytes, receives the data in block unit in response to the recovery control signal of said backup/recovery circuit, receives the enable signal of the first byte and second byte of each block from said backup/recovery control circuit, receives the enable signal of remaining bytes from said decoding means, updates the data of the activated byte of block through a read/write control and data bus of said database processing means, and outputs the updated data of block unit according to the backup control signal of said backup/recovery control circuit; and a nonvolatile memory which is divided into a plurality of blocks each of which is divided into a plurality of bytes, outputs the stored data of block unit to said volatile memory in response to the receiver control signal of said backup/recovery control circuit, and receives and stores the updated data of block unit from said volatile memory in response to the backup control signal of said backup/recovery control circuit.

8. A database recovery method applied to a database recovery apparatus using a nonvolatile memory constructed by dualization in a database system comprising the steps of:

a) copying a nonvolatile memory block of a first and second dual plane nonvolatile memory to a volatile memory block, updating the data of volatile memory block of said first and second dual plane nonvolatile memory, and thereafter checking whether the update performance partially succeeds;

b) informing, if the update succeeded in said step a), that backup is in effect for a power monitor and control circuit, copying the updated volatile memory block of said first dual plane nonvolatile memory, and thereafter checking whether the copy succeeds;

c) recovering, if the copy failed in said step b), said nonvolatile memory block of said first dual plane nonvolatile memory to a value prior to the update by using said nonvolatile memory block of said second dual plane nonvolatile memory, thereafter informing of the update failure to the power monitor and control circuit, and ending the transaction;

d) informing, if the copy succeeded in said step b), the progress of the backup to said power monitor and control circuit, copying said volatile memory block of said second dual plane nonvolatile memory to said nonvolatile memory block, and checking whether the copy succeeds;

e) informing, if the copy succeeded in said step d), that update is completed and ends the transaction, but if the copy failed, recovering said nonvolatile memory block of said second dual plane nonvolatile memory to the latest update value by using said nonvolatile memory block of said first dual plane nonvolatile memory, informing of the update and completion, and then ending the transaction; and f) discarding, if the update failed in said first step, the updated volatile memory block of said first and second dual plane nonvolatile memory, informing of the update failure, and ending the transaction.

9. A database recovering method utilizing a dual plane nonvolatile memory in a database system, said method comprising the steps of:

(a) copying a block unit of data from a nonvolatile memory to a volatile memory block unit in response to a backup/recovery control signal;

(b) updating the data copied to said volatile memory block in response to a read/write control signal;

(c) checking whether the updating partially succeeds;

(d) informing a power monitor and control circuit of a processing of the backup if the updating partially succeeds in said step (c);

(e) copying the updated data of said volatile memory to said nonvolatile memory block;

(f) informing said power monitor and control circuit of the completion of the updating step after completion of said step (e), and completing the transaction;

(g) discarding the updated data of said volatile memory if said updating fails in said step (c); and (h) indicating a failure of said updating step and completing the transaction.

* * * * *